US010593510B2

(12) United States Patent
Tromp

(10) Patent No.: US 10,593,510 B2
(45) Date of Patent: Mar. 17, 2020

(54) MEASURING SPHERICAL AND CHROMATIC ABERRATIONS IN CATHODE LENS ELECTRODE MICROSCOPES

(71) Applicant: International Business Machines Corporation, Armonk, NY (US)

(72) Inventor: Rudolf M. Tromp, North Salem, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/294,017

(22) Filed: Mar. 6, 2019

(65) Prior Publication Data
US 2019/0206655 A1 Jul. 4, 2019

Related U.S. Application Data

(62) Division of application No. 15/596,850, filed on May 16, 2017, now Pat. No. 10,283,315.

(51) Int. Cl.
*H01J 37/153* (2006.01)
*H01J 37/29* (2006.01)
(Continued)

(52) U.S. Cl.
CPC .......... *H01J 37/153* (2013.01); *H01J 37/145* (2013.01); *H01J 37/1472* (2013.01); *H01J 37/29* (2013.01);
(Continued)

(58) Field of Classification Search
CPC .. H01J 37/00; H01J 37/02; H01J 37/04; H01J 37/10; H01J 37/12; H01J 37/14;
(Continued)

(56) References Cited

U.S. PATENT DOCUMENTS 5,221,844 A 6/1993 Van Der Mast et al.
5,798,524 A 8/1998 Kundmann et al.
(Continued)

FOREIGN PATENT DOCUMENTS

CN 101606215 A 12/2009
JP 2006173027 A 6/2006
JP 2010153320 A 7/2010

OTHER PUBLICATIONS

Feng et al., "An x-ray photoemission electron microscope using an electron mirror aberration corrector for the study of complex materials", Journal of Physics Condensed Matter, Apr. 2005, pp. S1339-S1350.
(Continued)

*Primary Examiner* — Jason L McCormack
(74) *Attorney, Agent, or Firm* — Cantor Colburn LLP; Vazken Alexanian

(57) ABSTRACT

An electron microscope system and a method of measuring an aberration of the electron microscope system are disclosed. A method of controlling an aberration of an electron microscope includes obtaining a dispersed energy distribution for electrons at a diffraction plane of the electron microscope and placing an aperture at a selected location of the dispersed energy distribution in the diffraction plane. The method measures displacement of an image of the aperture in an image plane of the electron microscope for the selected location of the aperture. The method determines an aberration coefficient of the electron microscope from the measured displacement and the selected location of the aperture and alters a parameter of an element of the electron microscope to control the aberration of the electron microscope based at least in part on the determined aberration coefficient.

20 Claims, 4 Drawing Sheets

(51) Int. Cl.
*H01J 37/145* (2006.01)
*H01J 37/147* (2006.01)

(52) U.S. Cl.
CPC ..... *H01J 37/292* (2013.01); *H01J 2237/1508* (2013.01); *H01J 2237/1534* (2013.01); *H01J 2237/2602* (2013.01)

(58) Field of Classification Search
CPC .... H01J 37/141; H01J 37/147; H01J 37/1471; H01J 37/15; H01J 37/153; H01J 37/26; H01J 37/261
USPC .............................. 250/306, 307, 311, 396 R
See application file for complete search history.

(56) References Cited

U.S. PATENT DOCUMENTS

| | | | |
|---|---|---|---|
| 6,633,034 B1 | 10/2003 | Crewe | |
| 7,022,983 B2 | 4/2006 | Ose et al. | |
| 7,561,326 B2 | 7/2009 | Funk et al. | |
| 7,902,504 B2 | 3/2011 | Koike et al. | |
| 8,334,508 B1 | 12/2012 | Mankos | |
| 8,729,466 B1 | 5/2014 | Mankos | |
| 9,224,574 B2 | 12/2015 | Yoshida et al. | |
| 9,275,817 B2 | 3/2016 | Martin | |
| 2004/0149925 A1* | 8/2004 | Muller | B82Y 10/00 250/396 R |
| 2005/0017194 A1* | 1/2005 | Matsuya | H01J 37/153 250/396 R |
| 2007/0085033 A1* | 4/2007 | Buller | B82Y 10/00 250/492.1 |
| 2007/0181805 A1 | 8/2007 | Mori et al. | |
| 2007/0200062 A1* | 8/2007 | Tromp | H01J 37/05 250/305 |
| 2007/0200070 A1 | 8/2007 | Tromp et al. | |
| 2012/0199739 A1 | 8/2012 | Nakano et al. | |
| 2014/0103201 A1* | 4/2014 | Kramer | G21K 1/093 250/252.1 |
| 2016/0071683 A1 | 3/2016 | Mukai | |
| 2018/0337017 A1 | 11/2018 | Tromp | |

OTHER PUBLICATIONS

List of IBM Patents or Patent Applications Treated as Related; Date Filed: Jul. 1, 2019; 2 pages.
PCT International Search Report and Written Opinion; Application No. PCT/IB2018/053241; dated Sep. 14, 2018; 8 pages.
Rose et al., "Aberration Correction in Electron Microscopy", Proceedings of 2005 Particle Accelerator Conference, 2005, pp. 44-48.
Schmidt et al., "First experimental proof for aberration correction in XPEEM: Resolution, transmission enhancement, and limitation by space charge effects", Ultramiscroscopy, vol. 126, 2013, pp. 23-32.
Schmidt, et al.; "Double aberration correction in a low-energy electron microscope", Ultramicroscopy, journal homepage: www.elsevier.com/locate/ultramic; Ultramicroscopy, vol. 110 (2010); pp. 1358-1362.
Tromp et al.; "A new aberration-corrected, energy filtered LEEM/PEEM instrument II. Operation and results", Ultramicroscopy, journal homepage: www.elsevier.com/locate/ultramic; Ultramicroscopy, vol. 127 (2013); pp. 25-39.
Tromp et al.; "Aberrations of the cathode objective lens up to fifth order", Ultramicroscopy, journal homepage: www.elsevier.com/locate/ultramic; Ultramicroscopy, vol. 119 (2012); pp. 33-39.
Tromp, et al.; "A new aberration-corrected, energy-filtered LEEM/PEEM instrument 1. Principles and design", Ultramicroscopy, journal homepage: www.elsevier.com/locate/ultramic; Ultramicroscopy, vol. 110 (2010); pp. 852-861.
Tromp; "An adjustable electron achromat for cathode lens microscopy", Ultramicroscopy, journal homepage: www.elsevier.com/locate/ultramic; Ultramicroscopy, vol. 159 (2015); pp. 497-502.
Tromp; "Catadioptric aberration correction in cathode lens microscopy", Ultramicroscopy, journal homepage: www.elsevier.com/locate/ultramic; Ultramicroscopy, vol. 151 (2015); pp. 191-198.
Tromp; "Characterization of the cathode objective lens by Real-Space Microspot Low Energy Electron Diffraction", Ultramicroscopy, journal homepage: www.elsevier.com/locate/ultramic; Ultramicroscopy, vol. 130 (2013); pp. 2-6.
Tromp; "Measuring and correcting aberrations of a cathode objective lens", Ultramicroscopy, journal homepage: www.elsevier.com/locate/ultramic; Ultramicroscopy, vol. 111 (2011); pp. 273-281.
R. M. Trompet al., A new aberration-corrected, energy-filtered LEEMPEEM instrument: I. Principles and design, Ultramicroscopy 110 (2010), S.852-861. 10p.

* cited by examiner

MEASURING SPHERICAL AND CHROMATIC ABERRATIONS IN CATHODE LENS ELECTRODE MICROSCOPES

DOMESTIC PRIORITY

This application is a divisional of U.S. application Ser. No. 15/596,850, titled "MEASURING SPHERICAL AND CHROMATIC ABERRATIONS IN CATHODE LENS ELECTRODE MICROSCOPES" filed May 16, 2017, the contents of which are incorporated by reference herein in its entirety.

BACKGROUND

The present invention relates in general to controlling aberrations in imaging devices, and, more specifically, to systems and methods for measuring and controlling an amount of aberration in electron microscopes.

Electron microscopes use a beam of accelerated electrons to illuminate a sample being tested to obtain high resolution images of the sample. Due to multiple optical elements used to direct the electron beam and to form an image of the sample, the electron microscope tends to experience certain aberrations, such as chromatic aberration, spherical aberration, etc. While these optical elements can be adjusted to address the aberration, the aberrations must be measured before they can be addressed. Measuring spherical and chromatic aberrations in a Low Energy Electron Microscope (LEEM) or Photo Electron Emission Microscope (PEEM) is a laborious process that is time-consuming and difficult to automate. In one method of measuring spherical aberration, the incident beam angle and the contrast aperture of the electron microscope are scanned in unison. As the beam angle is scanned the image shifts due to spherical aberration, defocus, and astigmatism. From systematic measurements of image shift versus beam angle, these aberrations can be measured. Another method is known as Real Space Microspot Low Energy Electron Diffraction. In this case, the sample is illuminated with a small-spot electron beam. As the sample diffracts the incident beam into a multiple of reflected beams, each with well-known angles, the images of these beams do not exactly coincide in the image plane due to spherical aberration, defocus, and astigmatism. By measuring the relative displacements of these small-spot images, these aberrations can be measured. Both of these methods require a single crystal sample to generate diffracted beams, which is not always available. To measure chromatic aberration, the energy of an incident electron beam is varied. This method requires re-alignment of the microscope for every energy setting, which is a tedious procedure. Also, when photo electrons are used, neither of these methods works. The difficulty of such testing procedures tends to limit the number of times the electron microscope is calibrated. Accordingly, there is a need to develop a method for measuring aberrations in order to take steps to correct the aberrations more routinely, without laborious calibration and measurement protocols.

SUMMARY

According to other embodiments of the present invention, a method of controlling an aberration of an electron microscope includes obtaining a dispersed energy distribution for electrons at a diffraction plane of the electron microscope and placing an aperture at a selected location of the dispersed energy distribution in the diffraction plane; measuring displacement of an image of the aperture in an image plane of the electron microscope for the selected location of the aperture. The method determines an aberration coefficient of the electron microscope from the measured displacement and the selected location of the aperture and alters a parameter of an element of the electron microscope to control the aberration of the electron microscope based at least in part on the determined aberration coefficient.

According to other embodiments of the present invention, an electron microscope system includes an optical element for directing an electron beam of the electron microscope system and an aperture in a diffraction plane of the electron microscope for selecting a portion of a dispersed energy-momentum relation of the electron beam formed at the diffraction plane. The electron microscope system includes a processor configured to measure a displacement of an image of the aperture in an image plane of the electron microscope for the selected portion of the dispersed energy-momentum relation, determine an aberration coefficient from the measured displacement and the selected portion of the dispersed energy-momentum relation, and alter a setting of the optical element to control the aberration of the electron microscope based at least in part on the determined aberration coefficient.

According to other embodiments of the present invention, a method of operating an electron microscope includes obtaining a dispersed energy distribution for electrons at a diffraction plane of the electron microscope and placing an aperture at a selected location of the dispersed energy distribution in the diffraction plane. The method measures a detector displacement of an image of the aperture in an image plane of the electron microscope for the selected location of the aperture and determines, using a processor, an aberration coefficient of the electron microscope from the measured displacement and the selected location of the aperture. The method alters a setting of an element of the electron microscope to control the aberration of the electron microscope based at least in part on the determined aberration coefficient and obtains an image of a sample using the electron microscope having the controlled aberration.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the invention provide systems and methods to measure spherical and/or chromatic aberrations in cathode lens electron microscopes (e.g., Low Energy Electron Microscope (LEEM) and Photo Electron Emission Microscope (PEEM)) and to thereby control the spherical and/or chromatic aberrations. Using the dispersive properties of a magnetic prism array an energy vs momentum projection in the dispersive contrast aperture plane of the microscope is formed, by placing a narrow slit aperture in the entrance plane to a magnetic prism array. By scanning the contrast aperture in this dispersive plane and forming a real space image for each contrast aperture position, both spherical and chromatic aberration coefficients can be extracted from the image shifts from one aperture position to the next.

Figure 1:
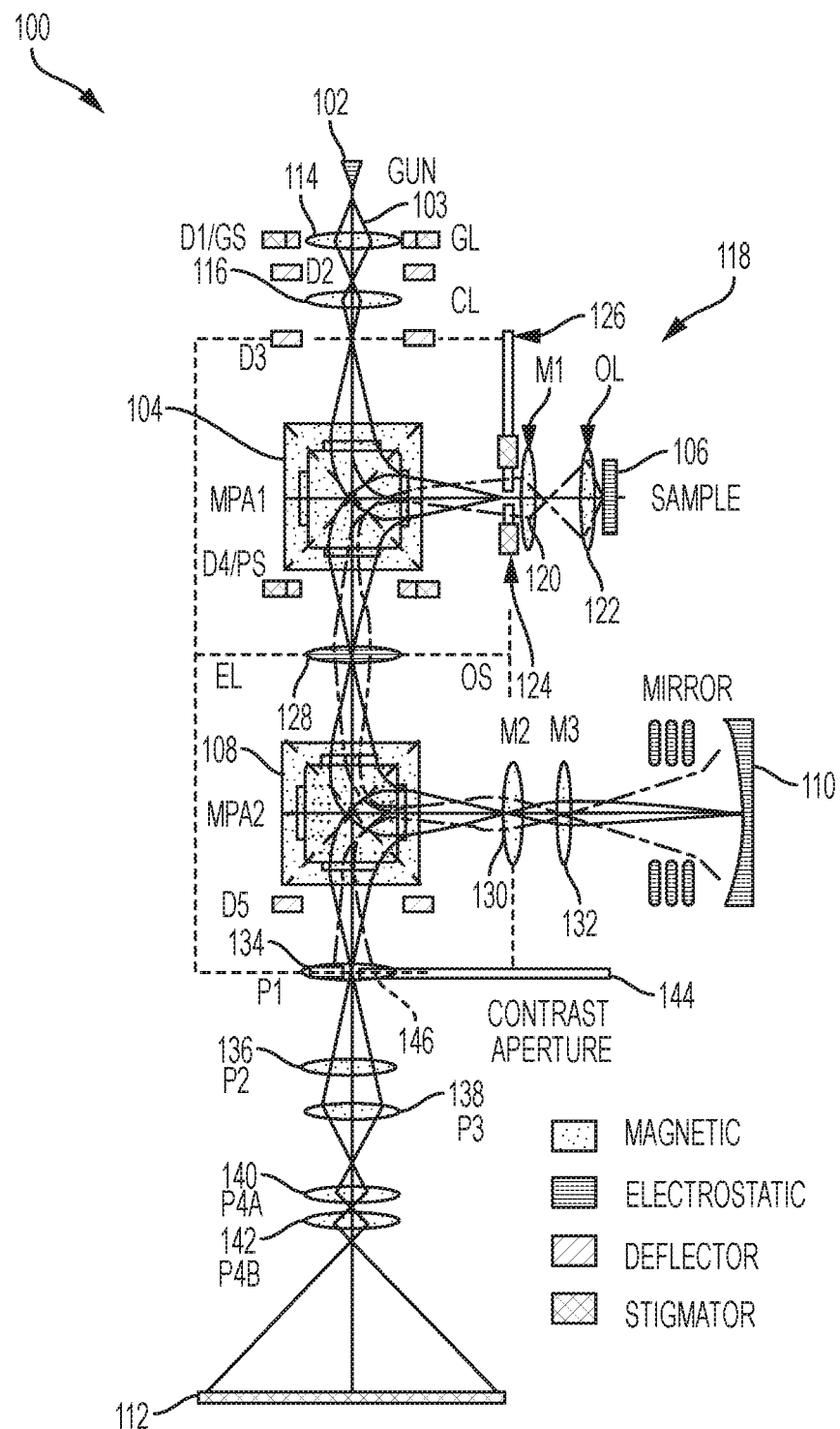
FIG. 1 depicts a schematic diagram of an exemplary electron microscope shown in accordance with embodiments of the invention.

With reference now to FIG. 1, a schematic diagram of an exemplary electron microscope 100 is shown according to embodiments of the invention. The electron microscope 100 includes, among others, an electron gun 102, a first Magnetic Prism Array (MPA1) 104, a sample 106, a second Magnetic Prism Array (MPA2) 108, a mirror 110 and a detector 112.

The electron gun 102 generates an electron beam 103 in the direction of MPA1 104. The electron beam 103 propagates along an optical axis that defines a z-direction in a coordinate system of the electron beam 103, wherein a y-direction is out of the plane of the page and an x-direction orthogonal to both the y-direction and the z-direction. While the z-direction can change with the direction of propagation, the y-direction maintains its direction out of the plane of the page and the x-direction remains orthogonal to both the y-direction and the z-direction.

The electron gun 102 can be any type of electron gun suitable for providing a beam of electrons at a selected energy, such as but not limited to a cold field emission gun. The generated electrons are focused by a gun lens (GL) 114 and a condenser lens (CL) 116 into an entrance plane of MPA1 104. MPA1 104 deflects the electron beam 103 over a 90 degree angle towards sample 106. Upon leaving MPA1 104, the electron beam 103 passes through an objective lens system 118 onto sample 106. The objective lens system 118 includes of a magnetic transfer lens M1 120 and an objective lens OL 122 that collimates the beam onto sample 106. In embodiments of the invention, the sample 106 is maintained at a potential so that incident electrons are decelerated to a selected energy range at the sample 106. After reflection from the sample 106, the electrons are accelerated back towards MPA1 104 by the objective lens system 118. MPA1 104 again deflects the electrons over a 90 degree angle towards MPA2 108. The electron beam passes through an electrostatic transfer lens EL 128 midway between MPA1 104 and MPA2 108. MPA2 108 deflects the electron beam 103 over a 90 degree angle onto a path directed towards mirror 110, thereby passing through magnetic lens M2 130 and magnetic lens M3 132 disposed between MPA2 104 and mirror 110. Upon reflection from mirror 110, the electron beam 103 again passes through magnetic lens M3 132 and magnetic lens M2 130 as it travels toward MPA2 108.

MPA2 again deflects the electron beam 103 over a 90 degree angle into a projector column that includes lenses P1-P4(A,B) (lenses 140 and 142, respectively) and detector 112. The magnetic transfer lens P1 projects the beam onto a projector lens P3. The combined settings of lens P3 and lenses P4A/P4B determine a magnification of the image on the detector. Alternatively, by exciting lens P2 (136) the diffraction pattern, or energy spectrum, can be placed in the object plane of P3 (138) for directed inspection on the image screen.

In the exemplary embodiment of FIG. 1, MPA1 and MPA2 deflect the electrons by 90 degrees. The amount of deflection by the MPA1 and MP2 is not an essential element of the electron microscope. Other electron microscope embodiments can deflect the electron beam by 60 degrees, or any other angle. The same method described herein for measuring aberration applies to these embodiments as well as to embodiments having other deflection angles.

Upon reaching the detector 112, the electron beam 103 has experienced various aberrations due to the various elements of the electron microscope, such as the objective lens, MPA1, MPA2, etc. In particular, such elements introduce image aberrations such as chromatic aberration and a spherical aberration, among others, to the electron beam 103. In order to correct the electron beam 103 for this aberration, the mirror 110, for example, or other optical elements can be adjusted in order to provide a counter-aberration (e.g., chromatic and/or spherical, etc.) to the electron beam 103 that counters and or cancels out the effects of the aberration due to the other beam-deforming elements of the electron microscope 100.

A contrast aperture 144 can be placed proximate the magnetic transfer lens P1 134 in order to select a portion of the electron beam for image formation for testing and calibration purposes. The contrast aperture 144 can be used and sample 106 placed in the electron beam 103 in order to obtain images of the sample 106.

In order to determine the aberration, one can observe a relation between a dispersion relation in a diffraction plane of the electron microscope (i.e., at lens P1) and an image formed at the detector 112. In embodiments of the invention, a diffraction pattern from the objective lens OL 122 is viewed. Plane OS indicates an image 124 of the diffraction plane of the objective lens OL 122. The geometry of the electron microscope is such that the diffraction pattern in diffraction plane 124 is reproduced at the P1 lens 134. In one embodiment, a contrast aperture 144 is placed a diffraction plane 146 located at the center of the P1 lens 134 and used to select portions of the electron beam 103 at various energy and momentum values. Observing the effects of the various energies and momentum values on the displacement of an image at the detector 112 can be used to determine the aberrations of the electron microscope.

At the diffraction plane 124, the electrons from the sample 106 form a distribution, with electron energies ranging from 0 to a maximum energy $E_m$ as indicated by an Ewald sphere. A radius of the Ewald sphere is related to the maximum values of in-plane $k_x$ and $k_y$ vectors at each electron energy. The Ewald sphere increases in diameter with the square root of the energy of the electrons as they interact with or are emitted by the sample (i.e., sqrt(E)). A narrow slit ("filter entrance slit") 126 is inserted at the diffraction plane 124 of the M1 magnetic transfer lens 120 between the M1 magnetic transfer objective lens 120 and MPA1 104. The narrow slit 126 is elongated in the y-direction normal to the plane of the drawing and narrow in the x-direction. The narrow slit 126 therefore allows electrons having a range of momentum values along the $k_y$ direction to pass through, but allows only a narrow slice of electrons in the $k_x$ direction to pass through. Before passing through the narrow slit 126, the energy vs. momentum distribution of the electron beam 103 is in the form of a three-dimensional paraboloid. The narrow slit 126 has the effect of passing through only a narrow slice (in the $k_x$ direction) from this paraboloid. MPA1 104, MPA2 108 and/or other energy-dispersive elements disperse this slice of the electron beam 103. At the diffraction plane of the P1 lens 134 at the exit of MPA2 (108), a parabolic dispersion relation appears that represents energy vs $k_y$-momentum. The momentum $k_y$ is directly related to an angle θ of the electrons relative to the optical axis.

Figure 2:
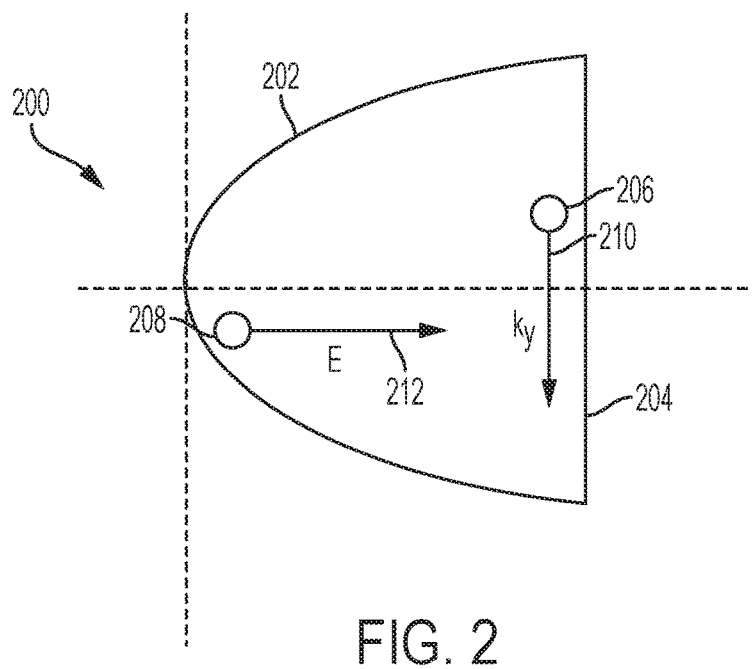
FIG. 2 depicts an energy-momentum dispersion relation at a diffraction plane of the electron microscope of FIG. 1.

FIG. 2 shows an energy-momentum dispersion relation 200 at the diffraction plane at the P1 lens 134 of the electron microscope of FIG. 1, in embodiments of the invention. The dispersion relation 200 is due to placing filter entrance slit 126 at the diffraction plane 124 of the objective lens 122. Boundary 202 is the Ewald sphere boundary related to the energy and momentum values of the electron beam 103. A contrast aperture 144 is inserted in the P1 diffraction plane, selecting only a small energy and momentum range. This aperture is used to pass electrons of a selected momentum and/or energy value. The aperture can be moved to pass through electrons of a plurality of momentum and/or energy values and a displacement of an image of the aperture can be viewed in order to determine aberration coefficients of the electron microscope 100.

Apertures 206 and 208 are shown in FIG. 2 to illustrate possible scanning methods of the diffraction plane. In embodiments of the invention, a single aperture is used which has the ability to move along the $k_y$ direction (as shown by aperture 206) and/or along the energy-dispersive direction (as shown by aperture 208). The apertures 206, 208 block the electron beam 103 at the diffraction plane 146 except for those values of energy and momentum at the location of the aperture 206, 208. Aperture 206 illustrates a method for scanning a plurality of $k_y$-momentum values at a constant energy value. The aperture 206 is moved along a $k_y$ direction shown by arrow 210 in order to select the plurality of $k_y$-momentum values at constant energy. Aperture 208 illustrates a method for scanning a plurality of energy values at a constant $k_y$-momentum. The aperture 208 is moved along an energy-dispersive direction shown by arrow 212 in order to select the plurality of energies at constant $k_y$-momentum. As the apertures 206, 208 move along the directions indicated their respective arrows 210, 212, the corresponding displacements of the sample image allowed through by the apertures 206, 208 are recorded at an image plane of the electron microscope, i.e., the detector 112. A relation can then be formed between selected energy/momentum values selected by the aperture and displacement of the sample image at the detector 112 in order to determine aberration coefficients for the electron microscope. The determined coefficients can then be used by the operator or a processor to adjust or alter a parameter of the electron microscope in order to control, reduce or diminish the aberrations of the microscope. In particular, by determining the aberration coefficients of the electron microscope 100, the mirror 110 of the electron microscope 100 can be adjusted in order to counter-balance the aberrations of the objective lens 122, so that the overall aberrations of the electron microscope 100 are controlled, reduced and/or minimized to zero or substantially zero.

In embodiments of the invention, spherical aberration is determined by moving aperture 206 through a plurality of $k_y$ values of the diffraction plane at constant energy, shown by arrow 210, which moves primarily in the $k_y$ direction. Each value of $k_y$ therefore corresponds to an angle θ of the electron beam 103 relative to an optical axis of the electron microscope. For each location of the aperture 206, an image of the sample (i.e., an image using the portion of the electron beam allowed through by the aperture 206) is recorded at detector 112. For a magnification of 1, as the aperture 206 is scanned across multiple $k_y$-values (i.e., θ-values), the image shifts by an amount $d=C_1*\theta^1+C_3*\theta^3$, where $C_1$ is a defocus and $C_3$ is a spherical aberration coefficient. Thus, by measuring image shift vs θ, it is possible to determine both defocus and spherical aberration. This procedure can be repeated for different values of E within the energy spectrum of the electrons. Therefore, $C_1$ and $C_3$ can be determined as a function of electron energy. In another embodiment, chromatic aberration is determined by moving aperture 208 along the energy axis as shown by arrow 212 to scan a plurality of energy values at a constant value of $k_y$. At the detector 112, an image of the sample is recorded for each position of the aperture 208 along the energy axis. The image shifts as a function of aperture position (i.e., energy). Comparison of the deflection of the image to aperture position provides information related to a chromatic aberration coefficient, which can thus be determined from these image shifts as a function of the position of the aperture 208 along the E-direction.

Figure 3:
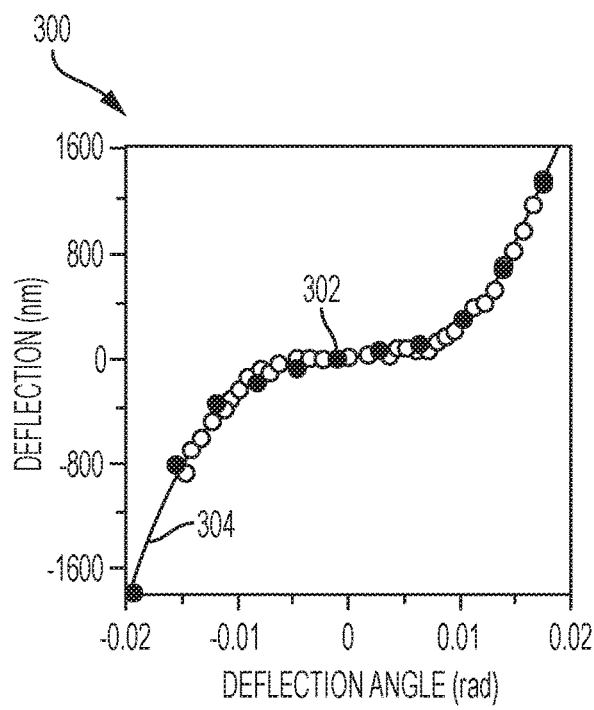
FIG. 3 depicts a relation between a displacement of the image at a detector of the electron microscope detector, for a variety of angle/momentum values selected by a contrast aperture at a constant energy at the diffraction plane in accordance with embodiments of the invention.

FIG. 3 shows a relation 300 between a displacement (deflection) of the electron beam at the detector 112 and momentum values selected by aperture 206 at a constant energy at the diffraction plane 146. The momentum values are shown by deflection angle along the abscissa (in radians) and the image deflection is shown along the ordinate (in micrometers). The energy of the electron beam at the beam sample for this particular scan is at a constant or substantially constant 25 eV. Data points are shown by circles 302. A curve 304 is drawn through the data points to obtain a best fit the data points, with the coefficients of the curve 304 being determined by a suitable method such as regression analysis. The coefficients of the curve 304 are indicative of a spherical aberration of the electron microscope 100. In particular, the displacement d of the image is related to the $k_y$-momentum by the equation: $d=C_1*\theta+C_3*\theta^3$, where θ is the angle shift at the diffraction plane (related to $k_y$), $C_3$ is the spherical aberration coefficient, and $C_1$ is a defocus. The cubic form of the curve 304 indicates that the image of the sample, having spherical aberrations, moves depending on the $k_y$-momentum of the electron beam. A beam without spherical or defocus aberrations is therefore represented as a flat horizontal line. While the slope of the illustrative curve 304 at θ=0 is zero, indicating that $C_1$=0, a non-zero slope can be found during examinations when defocus is non-zero.

Figure 4:
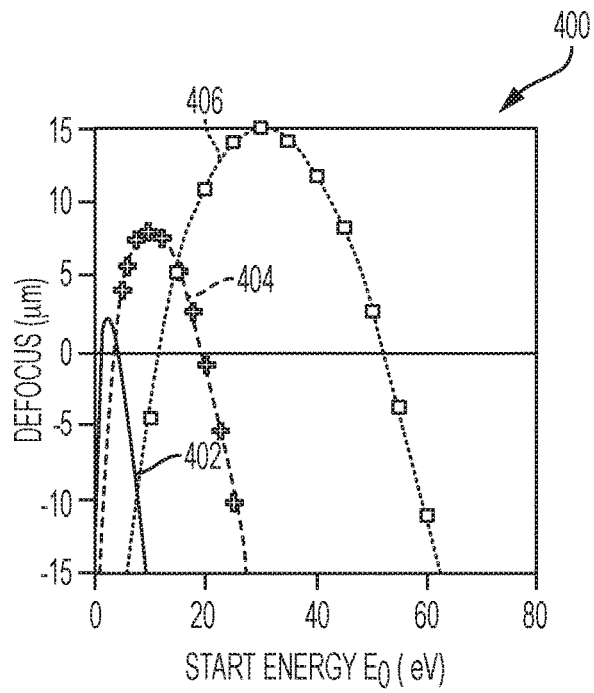
FIG. 4 depicts a relation between a defocus of the electron beam at the detector, at energy values selected by an aperture at a constant angle/$k_y$-momentum value at the diffraction plane in accordance with embodiments of the invention.

FIG. 4 shows a relation 400 between a defocus of the sample image at the detector 112 and energy values selected by aperture 208 at a constant $k_y$-momentum value at the diffraction plane 146. The energy values are shown along the abscissa (in eV) and the image defocus is shown along the ordinate (in micrometers). The curves 402, 404, 406 are related to energy by an equation that includes a chromatic aberration coefficient. Thus, the equation can be fit to the curves 402, 404, 406 in order to determine the spherical aberration coefficient. When the value of $k_y$ along which the aperture 208 is scanned along line 212 is not equal to zero, the energy dependent defocus also gives rise to an energy dependent image shift equal to $d=defocus*\theta^1$. Thus, the energy dependent defocus, which depends on the energy-dependent chromatic aberration as well as an additional defocus $C_1$ controlled by the operator, can be measured from the energy dependent image shift d at a suitable angle θ.

Figure 5:
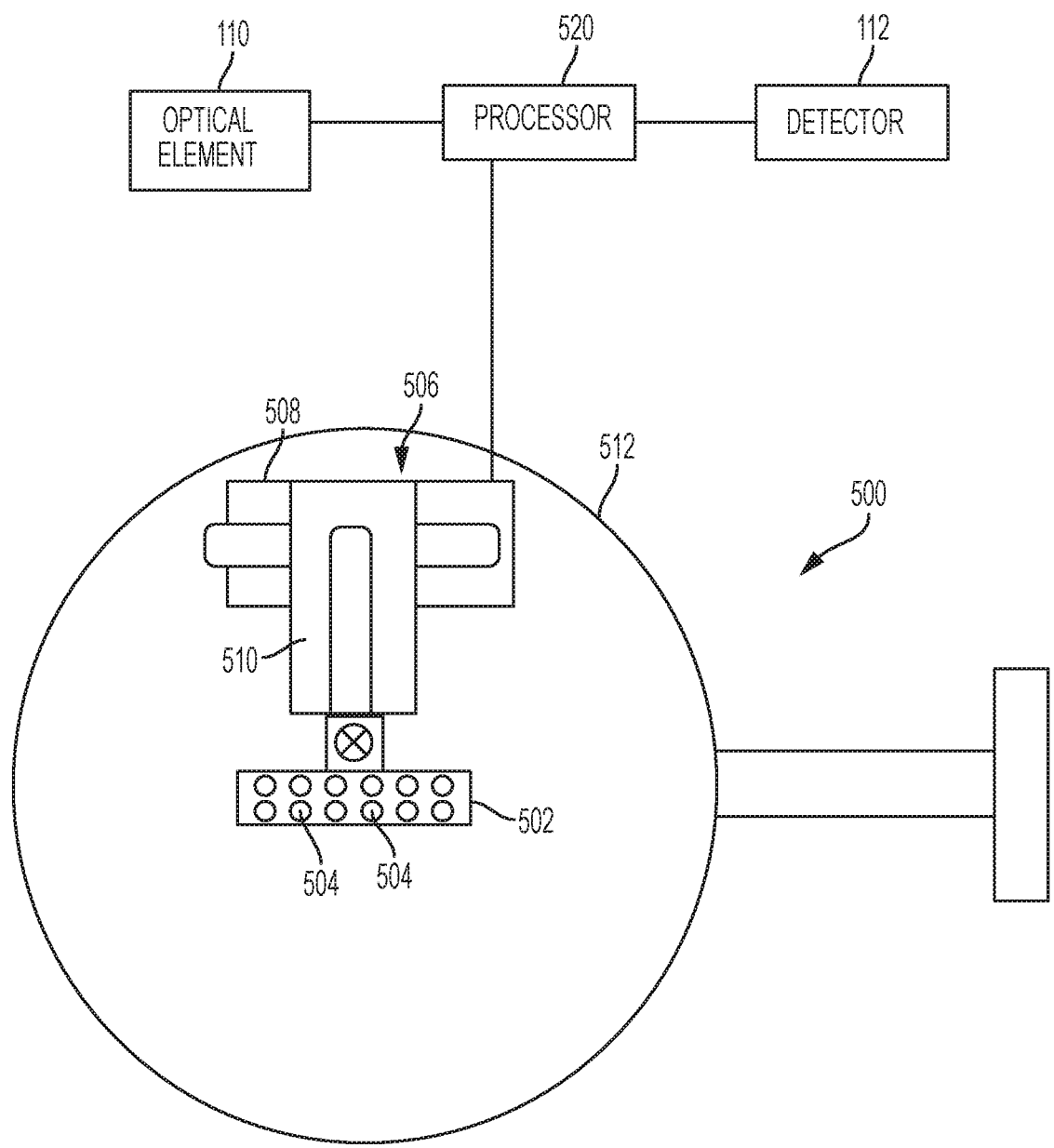
FIG. 5 depicts an illustrative aperture control mechanism for use at the diffraction plane of the electron microscope in order to determine the aberration coefficients of the electron microscope in accordance with embodiments of the invention.

FIG. 5 shows an illustrative aperture control mechanism 500 for use at the diffraction plane of the P1 lens 134 of the electron microscope 100 in order to determine the aberration coefficients of the electron microscope 100. The aperture control mechanism 500 can move the aperture into and out of location within the electron beam and the diffraction plane. The aperture control mechanism 500 includes an aperture manifold 502 having one or more apertures 504 therein. The plurality of apertures can have a set spatial relation with respect to each other. A position-encoded translator 506 drives the aperture manifold 502 along selected directions. The position-encoded translator 506 can be held in place at the diffraction plane by aperture support 512. In embodiments of the invention, position-encoded translator 506 includes an x-direction translator 508 and a y-direction translator 510. The x-direction translator 508 can be actuated to move the aperture manifold 502 along an energy-momentum axis of the dispersion relation and the y-direction translator 510 can be actuated to move the aperture manifold 502 along a $k_y$-axis. In embodiments of the invention, the translators 508, 510 can be actuated by piezo-electric devices. In various embodiments, the major axes of the $k_y$ vs E parabola are not aligned with the motion axes of the x-direction translator 408 and the y-direction translator 410. Therefore, a scan along either the E axis or the $k_y$-momentum axis can involve a compound motion of the translators 508, 510. Processor 520 can be used to move the translators 508, 510 and therefore to coordinate motion of the translators 508, 510 in order to move the aperture manifold 502 appropriately.

In embodiments of the invention, processor 520 controls motion of the aperture manifold 502 at the diffraction plane by controlling the linear translators 508, 510. Processor 520 measures the positions of the translators 508, 510 in order to determine the location of the aperture. The processor 520 also receives from detector 112 deflection measurements of the image that is passed by the aperture for a selected aperture location. Upon receiving a plurality of deflection measurements for a plurality of aperture locations, the processor 520 can then determine aberration coefficients using one or more of the relations shown in FIGS. 3 and 4. The processor 520 can determine a suitable aberration coefficient (spherical, chromatic, etc.) by, for example, performing a regression analysis on the data of image deflections and aperture locations. The processor 520 can then provide suitable commands for correcting for the aberration. In embodiments of the invention, the processor 520 can provide commands for adjusting an optical element of the electron microscope, such as the mirror 110 or other lens elements. Adjusting the optical element may include adjusting the settings of the mirror element 110 or adjusting a setting of the lens elements, such as adjusting a setting of a magnetic lens element or plurality of elements. By providing suitable adjustment of the optical element, induced aberrations at the optical element can cancel out or reduce the overall aberration of the electron microscope 100.

In another embodiment, the aperture manifold 502 includes a plurality of apertures 504 and the processor 520 maintains a map of the relative positions of the various apertures 504. Each of the apertures 504 has its own unique diameter. An aperture 504 can then be selected to allow a selected energy/momentum range to pass through the aperture. The processor 520 can quickly and accurately switch from one aperture 504 to another and thereby select a suitable energy and momentum range to be used in obtaining aberration measurements.

Figure 6:
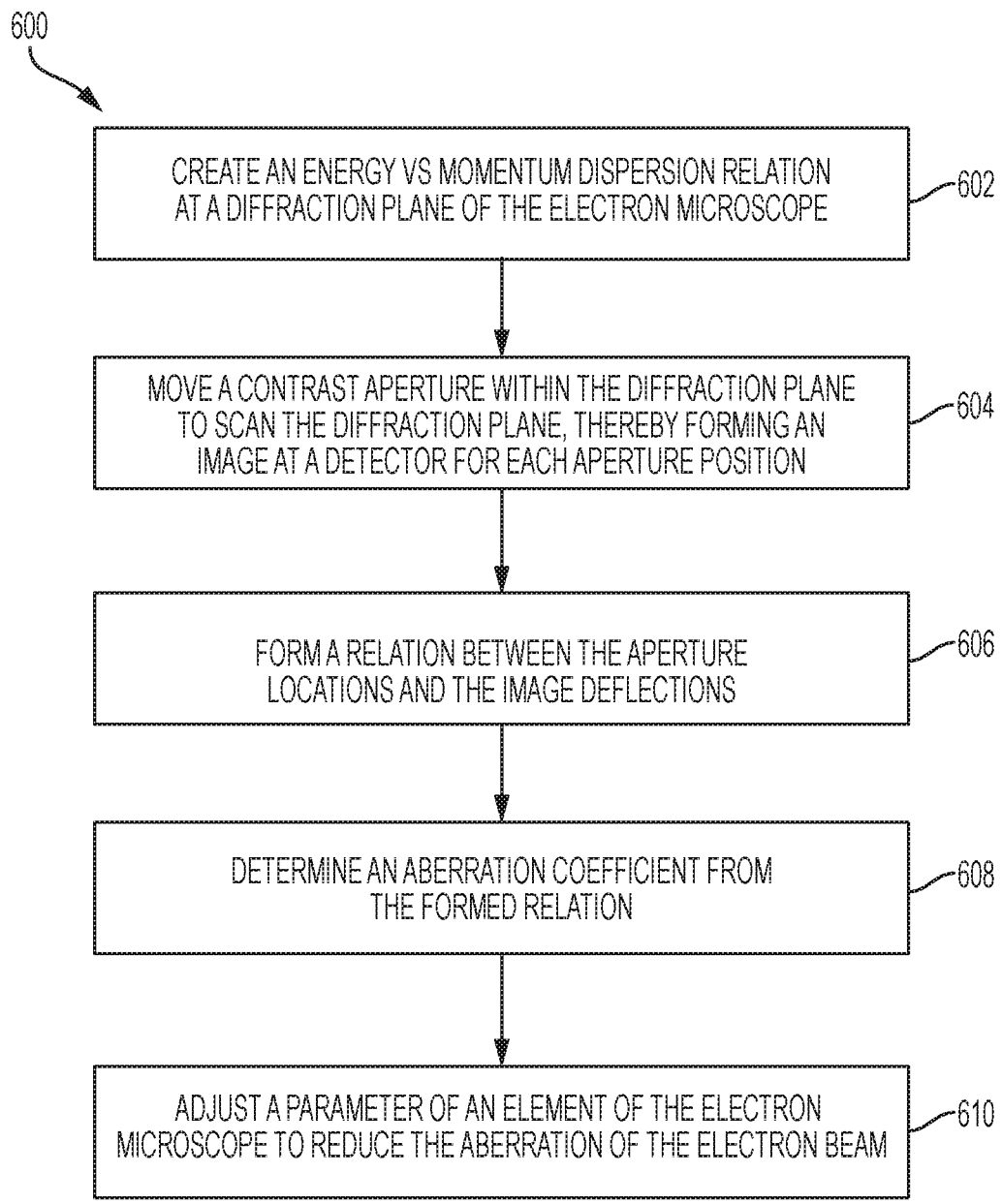
FIG. 6 depicts a flowchart illustrating a method for correcting aberrations in an electron microscope in accordance with embodiments of the invention.

FIG. 6 shows a flowchart 600 illustrating a method for correcting aberrations in an electron microscope, according to embodiments of the invention. In box 602, an energy vs momentum dispersion relation is formed in a diffraction plane of the electron microscope. In Box 604, an aperture is used in the diffraction plane to scan the diffraction plane, thereby forming an image at a detector for each aperture position. In box 606, a relation is formed between the aperture location and an image deflection at the detector. In box 608, an aberration coefficient is determined from the formed relation. In box 610, a parameter of an element of the electron microscope (e.g., a parameter of mirror 110) is adjusted in order to control and/or reduce the aberration of the electron microscope.

The method described herein can use an incident electron beam, but works equally well with photo emitted electrons. The method described herein allows for determining the aberrations of an electron microscope without the need to adjust or change the alignment of the electron beam, or of the electron microscope. This method therefore determines the aberrations of the electron microscope without changing any incident electron beam angle or energy, and provides methods for correcting the aberrations, once again without such adjustments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of controlling an aberration of an electron microscope, comprising:
   obtaining a dispersed energy distribution for electrons at a diffraction plane of the electron microscope;
   placing an aperture at a selected location of the dispersed energy distribution in the diffraction plane;
   measuring displacement of an image of the aperture in an image plane of the electron microscope for the selected location of the aperture;
   determining an aberration coefficient of the electron microscope from the measured displacement and the selected location of the aperture; and
   altering a parameter of an element of the electron microscope to control the aberration of the electron microscope based at least in part on the determined aberration coefficient.

2. The method of claim 1, wherein the electron microscope includes an optical element for controlling an electron beam of the electron microscope, the method further comprising altering a setting of the optical element to produce an aberration at the optical element to control the aberration of the electron microscope.

3. The method of claim 2, wherein the optical element is a mirror.

4. The method of claim 1, further comprising selecting a plurality of electron energies at a constant electron momentum with the aperture and determining a chromatic aberration coefficient based at least in part on displacement of the image with electron energy.

5. The method of claim 1, further comprising selecting a plurality of electron momenta at a constant electron energy using the aperture and determining a spherical aberration coefficient based at least in part on displacement of the image with electron momentum.

6. The method of claim 1 wherein the aperture is an aperture moveable within the diffraction plane.

7. The method of claim 6, further comprising measuring a second displacement of an image of the aperture in an image plane of the electron microscope for a second location of the aperture.

8. The method of claim 7, wherein determining an aberration coefficient of the electron microscope from the measured displacement and the selected location of the aperture further comprises determining an aberration coefficient of the electron microscope from the measured displacement and the selected location of the aperture and the second measured displacement and second location of the aperture.

9. An electron microscope system, comprising:
   an optical element for directing an electron beam of the electron microscope system;
   an aperture in a diffraction plane of the electron microscope for selecting a portion of a dispersed energy-momentum relation of the electron beam formed at the diffraction plane; and
   a processor configured to:
     measure a displacement of an image of the aperture in an image plane of the electron microscope for the selected portion of the dispersed energy-momentum relation;
     determine an aberration coefficient from the measured displacement and the selected portion of the dispersed energy-momentum relation; and
     alter a setting of the optical element to control the aberration of the electron microscope based at least in part on the determined aberration coefficient.

10. The electron microscope system of claim 9, wherein the aperture further includes a plurality of apertures and the processor selects an aperture which passes through a desired range of angles and energies.

11. The electron microscope system of claim 9, wherein the aperture selects a plurality of electron energies at a constant electron momentum and the processor determines a chromatic aberration coefficient based at least in part on displacement of the image with electron energy.

12. The electron microscope system of claim 9, wherein the aperture selects a plurality of electron momenta at constant electron energy and the processor determining a spherical aberration coefficient based at least in part on displacement of the image with electron momentum.

13. The electron microscope system of claim 9, wherein the optical element is a mirror.

14. The electron microscope system of claim 9, wherein the aperture is movable with the diffraction plane.

15. A method of operating an electron microscope, comprising:
   obtaining a dispersed energy distribution for electrons at a diffraction plane of the electron microscope;
   placing an aperture at a selected location of the dispersed energy distribution in the diffraction plane;
   measuring at a detector displacement of an image of the aperture in an image plane of the electron microscope for the selected location of the aperture;
   determining, using a processor, an aberration coefficient of the electron microscope from the measured displacement and the selected location of the aperture;
   altering a setting of an element of the electron microscope to control the aberration of the electron microscope based at least in part on the determined aberration coefficient; and
   obtaining an image of a sample using the electron microscope having the controlled aberration.

16. The method of claim 15, wherein the aperture selects a plurality of electron energies at a constant electron momentum and the processor determines a chromatic aberration coefficient based at least in part on displacement of the image with electron energy.

17. The method of claim 15, wherein the aperture selects a plurality of electron momenta at constant electron energy and the processor determining a spherical aberration coefficient based at least in part on displacement of the image with electron momentum.

18. The method of claim 15, wherein the optical element is a mirror.

19. The method of claim 15, further comprising placing the aperture in the diffraction plane in order to determine the aberration coefficient and removing the aperture from the diffraction plane to obtain the image of the sample.

20. The method of claim 15, wherein the aperture is movable within the diffraction plane.

* * * * *